United States Patent [19]

Ninomiya

[11] Patent Number: 5,305,260

[45] Date of Patent: Apr. 19, 1994

[54] ELECTRICALLY ERASABLE AND PROGRAMMABLE READ ONLY MEMORY DEVICE VERIFIABLE WITH STANDARD EXTERNAL POWER VOLTAGE LEVEL

[75] Inventor: Kazuhisa Ninomiya, Tokyo, Japan

[73] Assignee: NEC Corporation, Tokyo, Japan

[21] Appl. No.: 22,312

[22] Filed: Feb. 25, 1993

[30] Foreign Application Priority Data

Feb. 28, 1992 [JP] Japan .................. 4-042696

[51] Int. Cl.⁵ .................. G11C 7/00; G11C 16/00
[52] U.S. Cl. .................. 365/189.09; 365/189.06; 365/189.11
[58] Field of Search .................. 365/189.09, 189.06, 365/189.11; 307/296.1

[56] References Cited

U.S. PATENT DOCUMENTS

| | | | |
|---|---|---|---|
| 4,737,936 | 4/1988 | Takeuchi | 365/185 X |
| 4,951,257 | 8/1990 | Imamiya et al. | 365/189.09 X |
| 5,124,945 | 6/1992 | Schreck | 365/185 |
| 5,153,467 | 10/1992 | Mao | 365/189.09 X |

Primary Examiner—Eugene R. LaRoche
Assistant Examiner—Son Dinh
Attorney, Agent, or Firm—Sughrue, Mion, Zinn, Macpeak & Seas

[57] ABSTRACT

An electrically erasable and programmable read only memory device executes a verifying operation on a selected memory cell after a programming operation, and a predetermined voltage higher than a read-out voltage is applied to the control gate electrode to see whether or not the threshold level of the selected memory cell is high enough to remain in the programmed state, wherein the predetermined voltage is internally produced from an external power voltage level so that an electronic system is not expected to be equipped with a source of predetermined voltage, thereby making the electronic system simple.

3 Claims, 5 Drawing Sheets

ELECTRICALLY ERASABLE AND PROGRAMMABLE READ ONLY MEMORY DEVICE VERIFIABLE WITH STANDARD EXTERNAL POWER VOLTAGE LEVEL

FIELD OF THE INVENTION

This invention relates to an electrically erasable and programmable read only memory device and, more particularly, to an electrically erasable and programmable read only memory device for verifying a programming operation with a standard external power voltage level.

DESCRIPTION OF THE RELATED ART

A typical example of the electrically erasable and programmable read only memory device comprises a memory cell array 1 fabricated from a plurality of memory cells arranged in rows and columns, and the memory cells are of the floating gate type metal-oxide-semiconductor field effect transistor. The source nodes of the memory cells are coupled with a source line (not shown . A plurality of word lines WL are respectively associated with rows of the memory cells, and are respectively coupled with the control gate electrodes of the associated memory cells. A plurality of digit lines DL are respectively associated with the columns of the memory cells, and are respectively coupled with the drain nodes of the associated columns.

In order to select a word line, a row address decoder circuit 2 is coupled with the plurality of word lines WL, and is accompanied with a row address buffer circuit 3. External row address bits are supplied to the row address buffer circuit 3, and the row address buffer circuit 3 produces row address predecoded signals APDx. The row address decoder circuit 2 is responsive to the row address predecoded signals APDx for selectively driving the word lines WL.

Column address bits are supplied to a column address buffer circuit 4, and the column address buffer circuit 4 produces column address predecoded signals APDy. The column address predecoded signals APDy are supplied to the column address decoder/ selector unit 5, and the column address decoder/ selector unit 5 couples one of the digit lines DL with a sense amplifier circuit 7 or a write-in circuit 8.

As will be better seen from FIG. 2 of the drawings, the sense amplifier circuit 7 comprises a reference circuit 7a and a comparator 7b for comparing current Im with reference current Ir. The reference circuit 7a is implemented by a series of an n-channel enhancement type load transistor Qn1 and an n-channel floating gate type dummy memory cell DM, and a positive power voltage level Vcc of 5 volts is applied to the gate electrode of the n-channel enhancement type load transistor Qn1 and the control gate of the n-channel floating gate type dummy memory cell DM. The n-channel enhancement type load transistor Qn1 is equivalent to each n-channel enhancement type transfer transistor Qn2 forming a part of the column selector 5a of the column decoder selector unit 5, and the threshold level of the n-channel floating gate type dummy memory cell DM is regulated to a certain value between high threshold level and low threshold level of each n-channel floating gate type memory cell M11, M12, Mm1, Mm2, . . . of the memory cell array 1.

Turning back to FIG. 1, both of the write-in circuit 8 and the sense amplifier circuit 7 are coupled with an input/ output data buffer unit 9, and a control unit 10 controls the address buffer circuits 3 and 4, the row address decoder unit 2, the column address decoder/selector unit 5, the sense amplifier circuit 7, the write-in circuit 8 and the input/ output data buffer unit 9. Namely, various external control signals such as a chip enable signal CE and an output enable signal OE are supplied to the control unit 10, and the control unit 10 controls those component circuits 2 to 9 for an erasing operation, a programming operation, a verifying operation and a read-out operation.

In the erasing operation, electrons accumulated in the floating gates of all the n-channel floating gate type memory cells are evacuated to the source line (not shown), and the n-channel floating gate type memory cells M11 to Mm2 are decreased in threshold to the low level ranging between 1 volt and 2 volts.

On the other hand, an extremely high write-in voltage Vpp is applied from the write-in circuit 8 through the column selector 5a and the digit line to the drain node of a selected memory cell, and electrons are injected into the floating gate electrode of the selected memory cell in the programming operation. Then, the selected memory cell is increased in threshold level toward the high level. When the programming operation is carried out, the verifying operation follows, and the n-channel floating gate type memory cell is checked to see whether or not the threshold level is elevated to an appropriate level usually higher than 7 volts. If not, the programming operation is repeated. In the verifying operation, a verify voltage level is applied to the control gate electrode to see whether or not the threshold level is higher than the verify voltage level, and the sense amplifier circuit 7 determines the threshold level to be higher or lower than the verify voltage level as similar to the read-out operation.

In the read-out operation, the row address bits and the column address bits cause the row address decoder unit 2 and the column address decoder/ selector unit 5 to select an n-channel floating gate type memory cell from the memory cell array The row address decoder unit 2 supplies the positive power voltage level Vcc to the associated word line, and the column selector 5a allows the current Im to flow into the associated digit line. If the selected memory cell has the low threshold level, the n-channel floating gate type memory cell fully turns on, and the current Im passes therethrough. On the other hand, if the selected memory cell has the high threshold level, the current Im does not flow through the selected memory cell. The comparator 7b compares the current Im with the reference current Ir, and determines the threshold level to be high or low. The sense amplifier circuit 7 reports the result to the input/ output data buffer unit 9, and the input/ output data buffer unit 9 produces an output data signal of either logic level depending upon the threshold level of the selected memory cell.

The verify voltage level applied to the control gate electrode in the verifying operation is higher than the positive voltage level Vcc applied to the control gate electrode in the read-out operation, and the verify voltage level higher than the positive power voltage level Vcc enhances the reliability of the data bit stored in the n-channel floating gate type memory cell. The verify voltage level is supplied from an external voltage source instead of the positive power voltage level Vcc during the verifying operation.

If the electrically erasable and programmable read only memory device is used as a non-volatile data storage of an electronic system, the electronic system rewrites data bits stored in the electrically erasable and programmable read only memory device. As described hereinbefore, the data bits are rewritten through the erasing and programming operations, and the verifying operation is carried out after every programming operation. This means that an appropriate source of the predetermined voltage level should be incorporated in the electronic system, and the source of the predetermined voltage level makes the electronic system complex.

SUMMARY OF THE INVENTION

It is therefore an important object of the present invention to provide an electrically erasable and programmable read only memory device which can verify data bits without an external higher voltage for a verifying operation.

To accomplish the object, the present invention proposes to internally step up or down one of power voltage levels in a verifying operation.

In accordance with one aspect of the present invention, there is provided an electrically erasable and programmable read only memory device selectively entering an erasing mode, a programming mode, a verifying mode and a read-out mode of operation, comprising: a) a plurality of electrically erasable and programmable memory cells having respective accumulating electrodes for accumulating carriers, and respective control electrodes associated with the accumulating electrodes for producing respective conductive channels between respective source nodes and respective drain nodes under the influence of the accumulating electrodes, and each selectively entering an erased state and a programmed state depending upon the amount of the carriers accumulated in the accumulating electrode; b) a plurality of word lines selectively coupled with the control electrodes of the plurality of electrically erasable and programmable memory cells; c) a plurality of digit lines selectively coupled with the drain nodes of the plurality of electrically erasable and programmable read only memory cells; d) a word line selecting means coupled with the plurality of word lines, and supplying a read-out voltage to one of the plurality of word lines in the read-out mode and a verify voltage higher than the read-out voltage in the verifying mode; e) a verify voltage producing circuit operative to produce the verify voltage from a power voltage supplied from the outside of the electrically erasable and programmable read only memory device in the verifying mode, and supplying the verify voltage to the word line selecting means; f) a sense amplifier unit operative to check an electrically erasable and programmable read only memory cell selected from the plurality of electrically erasable and programmable read only memory cells to be whether in the erased state or in the programmed state; g) a write-in unit supplying a written voltage to an electrically erasable and programmable read only memory cell selected from the plurality of electrically erasable and programmable read only memory cells for injecting the carriers into the accumulating electrode; h) a column selecting means operative to couple one of the plurality of digit lines to the sense amplifier unit in the verifying mode and the read-out mode and to the write-in unit in the programming mode; and i) a data buffer unit coupled with the sense amplifier unit and the write-in unit, and operative to supply a write-in data signal to the write-in unit in the programming mode and to produce a read-out data signal in the verifying mode and the read-out mode.

In accordance another aspect of the present invention, there is provided an electrically erasable and programmable read only memory device selectively entering an erasing mode, a programming mode, a verifying mode and a read-out mode of operation, comprising: a) a plurality of electrically erasable and programmable memory cells having respective accumulating electrodes for accumulating carriers, and respective control electrodes associated with the accumulating electrodes for producing respective conductive channels between respective source nodes and respective drain nodes under the influence of the accumulating electrodes, and each selectively entering an erased state and a programmed state depending upon the amount of the carriers accumulated in the accumulating electrode; b) a plurality of word lines selectively coupled with the control electrodes of the plurality of electrically erasable and programmable memory cells; c) a plurality of digit lines selectively coupled with the drain nodes of the plurality of electrically erasable and programmable read only memory cells; d) a word line selecting means coupled with the plurality of word lines, and supplying a read-out voltage to one of the plurality of word lines in the read-out mode and the verifying mode; e) a source lines coupled with the source nodes of the plurality of electrically erasable and programmable read only memory cells; f) a verify voltage producing circuit operative to produce a verify voltage opposite in polarity than the read-out voltage from a constant voltage supplied from the outside of the electrically erasable and programmable read only memory device in the verifying mode, and supplying the verify voltage to the source line; g) a sense amplifier unit operative to check an electrically erasable and programmable read only memory cell selected from the plurality of electrically erasable and programmable read only memory cells to be whether in the erased state or in the programmed state; h) a write-in unit supplying a write-in voltage to an electrically erasable and programmable read only memory cell selected from the plurality of electrically erasable and programmable read only cells for injecting the carriers into the accumulating electrode; i) a column selecting means operative to couple one of the plurality of digit lines to the sense amplifier unit in the verifying mode and the read-out mode and to the write-in unit in the programming mode; and j) a data buffer unit coupled with the sense amplifier unit and the write-in unit, and operative to supply a write-in data signal to the write-in unit in the programming mode and to produce a read-out data signal in the verifying mode and the read-out mode.

BRIEF DESCRIPTION OF THE DRAWINGS

The feature and advantages of the electrically erasable and programmable read only memory device according to the present invention will be more clearly understood from the following description taken in conjunction with the accompanying drawings in which.

DESCRIPTION OF THE PREFERRED EMBODIMENTS

First Embodiment

Figure 1:
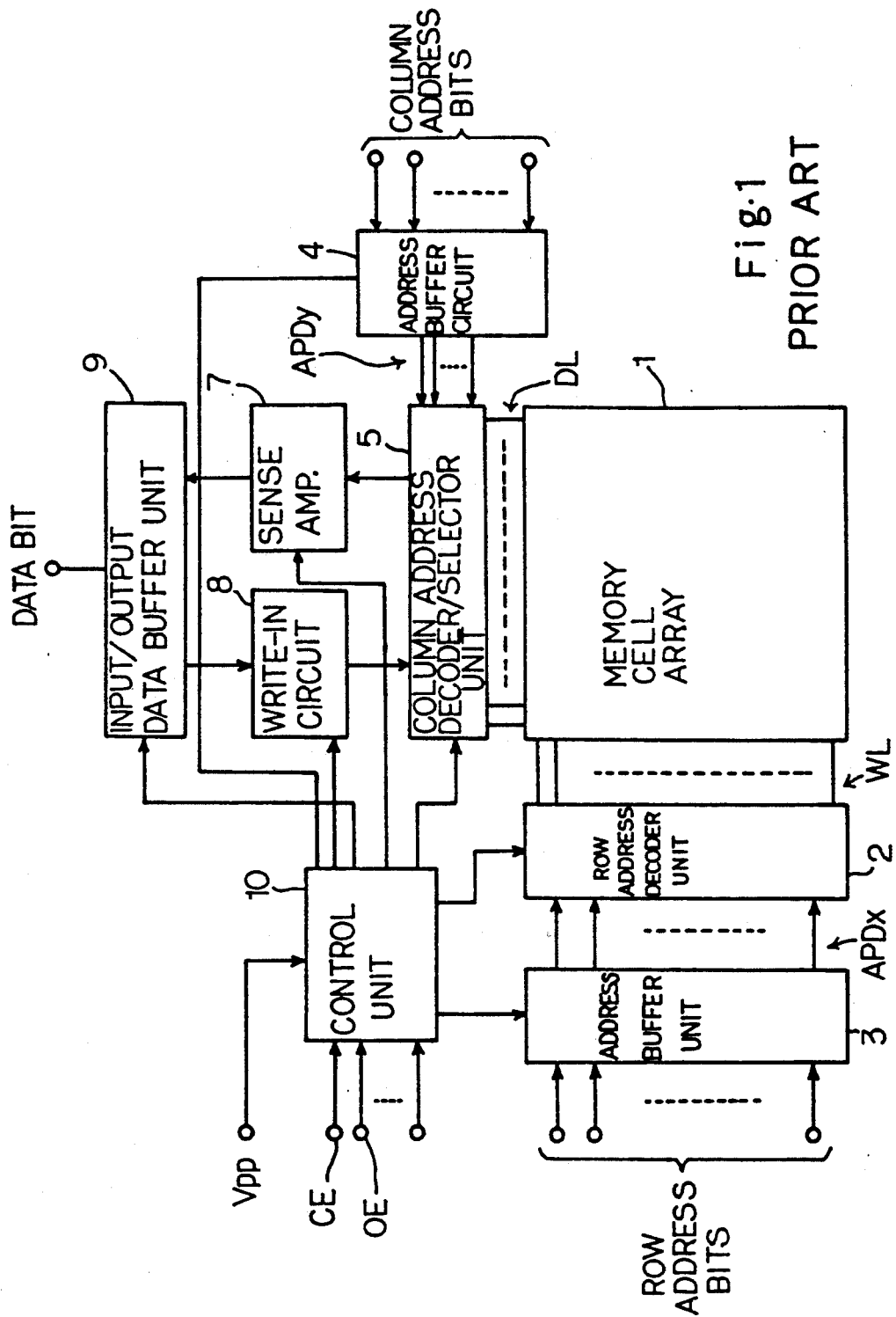
FIG. 1 is a block diagram showing the circuit arrangement of the prior art electrically erasable and programmable read only memory device.
Figure 2:
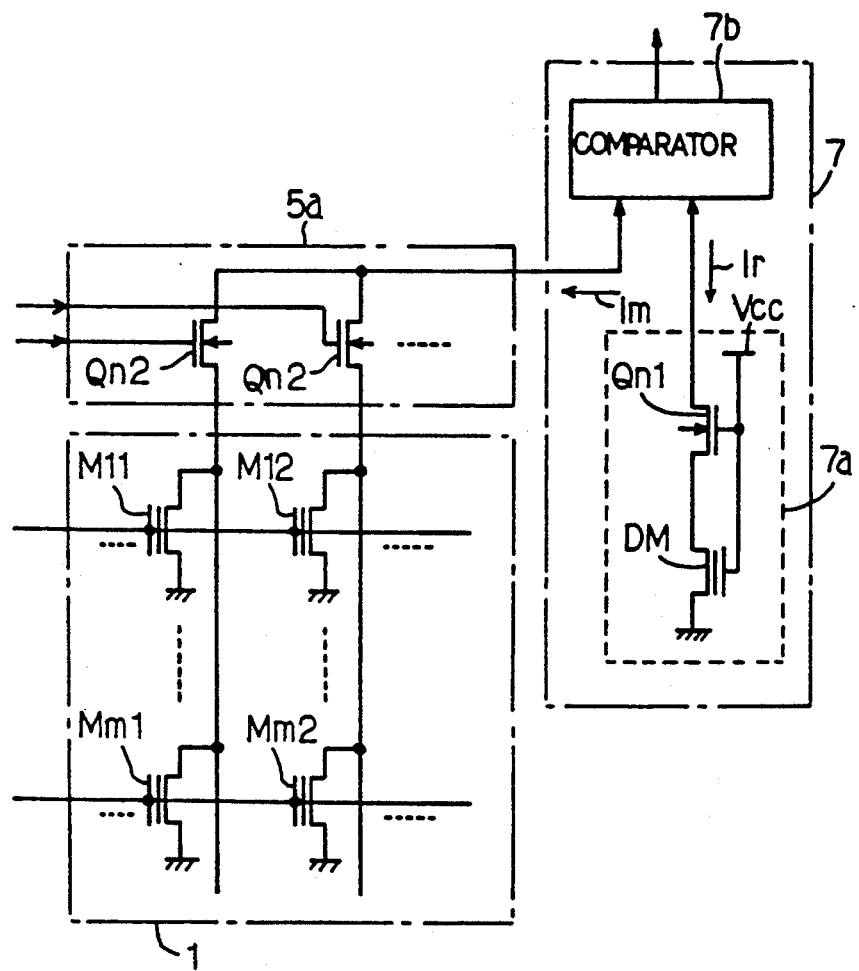
FIG. 2 is a circuit diagram showing the memory Cell array and the sense amplifier circuit incorporated in the electrically erasable and programmable read only memory device.
Figure 3:
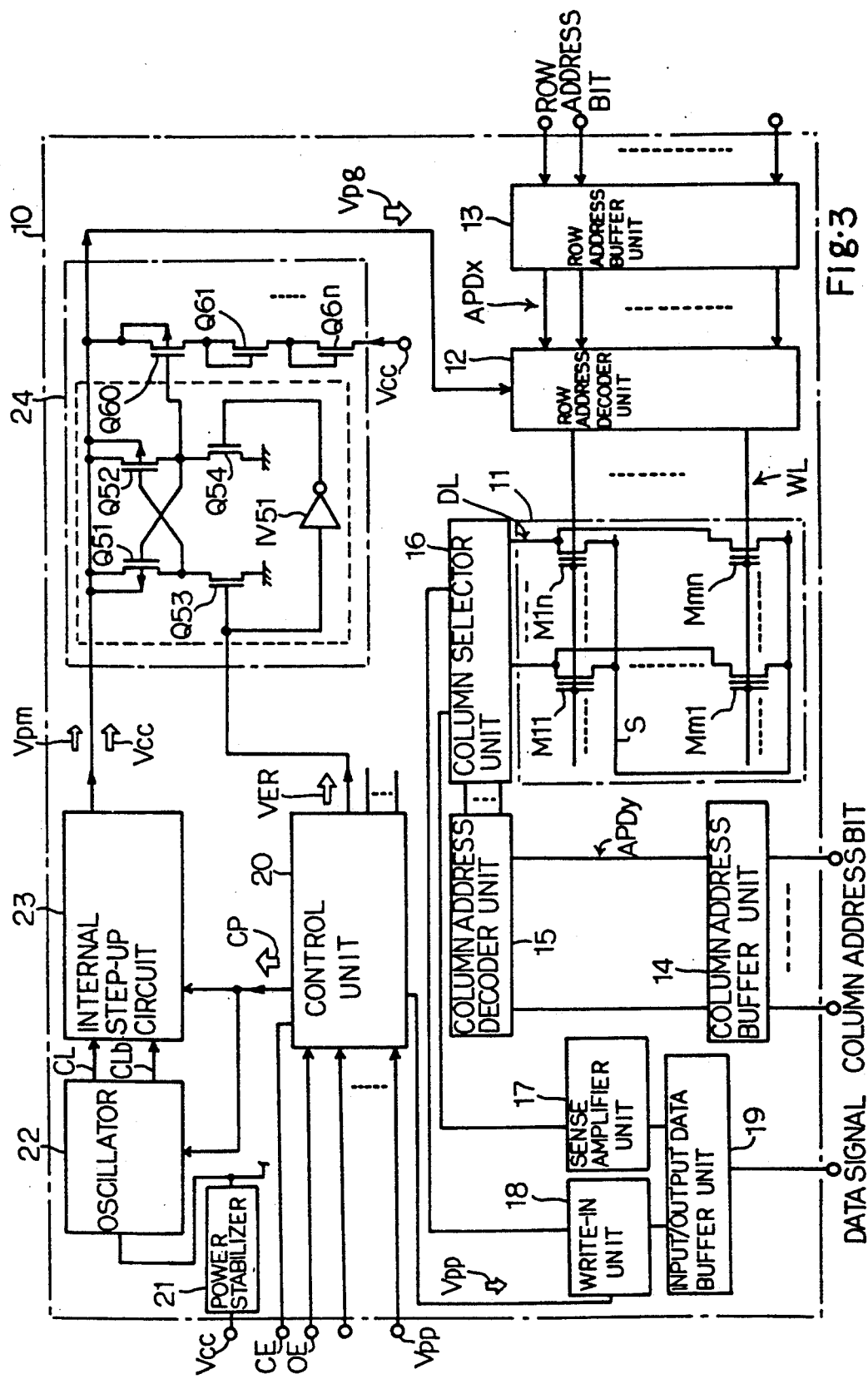
FIG. 3 is a block diagram showing the arrangement of an electrically erasable and programmable read only memory device according to the present invention.

Referring to FIG. 3 of the drawings, an electrically erasable and programmable read only memory device embodying the present invention is fabricated on a semiconductor substrate 10, and comprises a memory cell array 11 fabricated from a plurality of memory cells M11, M1n, Mm1 and Mmn arranged in rows and columns. The memory cells M11 to Mmn are of an n-channel floating gate type field effect transistor, and the floating gate electrode of each memory cell serves as an accumulating electrode.

The source nodes of the memory cells are coupled with a source line S. A plurality of word lines WL are respectively associated with rows of the memory cells M11 to Mmn, and are respectively coupled with the control gate electrodes of the associated memory cells M11 to Mmn. A plurality of digit lines DL are respectively associated with the columns of the memory cells M11 to Mmn, and are respectively coupled with the drain nodes of the associated memory cells M11 to Mmn.

In order to select a word line, a row address decoder circuit 12 is coupled with the plurality of word lines WL, and is accompanied with a row address buffer circuit 13. External row address bits are supplied to the row address buffer circuit 13, and the row address buffer circuit 13 produces row address predecoded signals APDx. The row address decoder circuit 12 is responsive to the row address predecoded signals APDx for selectively driving the word lines WL.

Column address bits are supplied to a column address buffer circuit 14, and the column address buffer circuit 14 produces column address predecoded signals APDy. The column address predecoded signals APDy are supplied to the column address decoder unit 15, and the column address decoder unit 15 causes a column selector unit 16 to couple one of the digit lines DL with a sense amplifier unit 17 or a write-in circuit 18. The sense amplifier unit 17 supplies current through the column selector unit 16 to one of the digit lines DL, and compares the current with reference current to determine a selected memory cell whether in an erased state or in a programmed state. The write-in unit supplies a write-in voltage Vpp much higher than a power d voltage Vcc through the column selector unit 16 to one of the digit lines DL, and causes electrons produced at the pn junction of the drain node and the semiconductor substrate 10 to be accumulated in the floating gate electrode.

Both of the write-in circuit 18 and the sense amplifier unit 17 are coupled with an input/output data buffer unit 19. A write-in data signal is temporally stored in the input/output data buffer unit 19, and is supplied to the write-in unit 18. When the sense amplifier unit 17 determines the state of the accessed memory cell, the input/output data buffer unit 19 produces an output data signal indicative of the state of the accessed memory cell, and the output data signal is supplied to the outside of the electrically erasable and programmable read only memory device.

A control unit 20 is responsive to external control signals for controlling the component circuits. For example, the control circuits 20 allows the electrically erasable and programmable read only memory device to selectively enter an erasing mode, a programming mode, a verifying mode and a read-out mode of operation depending upon combination of a chip enable signal CE and an output enable signal OE. The four modes of operation will be described hereinlater.

A power stabilizer 21 is coupled with an external power supply pin Vcc, and distributes a positive power voltage Vcc of 5 volts to the component circuits. An oscillator 21 is responsive to an internal control signal CP of active low voltage level, and produces internal clock pulses CL and CLb from the positive power voltage Vcc. The clock pulses CL and CLb are supplied to an internal step-up circuit 23, and the internal step-up circuit 23 is also responsive to the internal control signal CP. While the internal control signal CP is in the inactive high voltage level, the internal step-up circuit only relays the positive power voltage Vcc to a voltage clamping circuit 24. However, if the internal control signal CP goes down to the active low voltage level, the internal step-up circuit starts producing a boosted voltage level Vpm higher than the positive power voltage Vcc.

The voltage clamping circuit 23 comprises two series combinations of p-channel enhancement type load transistors Q51 and Q52 and n-channel enhancement type switching transistors Q53 and Q54 coupled between the output node of the internal step-up circuit 23 and the ground voltage line, an inverter circuit IV51 and a series combination of a p-channel enhancement type switching transistor Q60 and n-channel enhancement type load transistors Q61 to Q6n coupled between the output node of the internal step-up circuit 23 and the positive power voltage line Vcc. The gate electrode of one of the p-channel enhancement type load transistors Q51 and Q52 are respectively coupled with the drain node of the other of the p-channel enhancement type load transistors Q51 and Q52, and the n-channel enhancement type switching transistors Q53 and Q54 are gated by the internal control signal VER and the complementary signal thereof. The p-channel enhancement type switching transistor Q60 is gated by the drain node of the p-channel enhancement type load transistor Q52. The voltage clamping circuit 24 is responsive to an other internal control signal VER of active low voltage level indicative of the verifying mode. While the internal control signal VER remains in inactive high voltage level, the voltage clamping circuit 24 relays the voltage level from the internal step-up circuit 23 to the row address decoder unit 12. However, if the internal control signal VER goes down to the active low voltage level, the voltage clamping circuit 24 fixes a verify voltage level Vpg to a predetermined value. The verify voltage level Vpg is given by Equation 1.

$$Vpg = Vcc + n \times Vth \qquad \text{Equation 1}$$

where n is the number of load transistors Q61 to Q6n and Vth is the threshold of each load transistor Q61 to Q6n. Therefore, the row address decoder circuit 12 can drive one of the word lines WL to the verify voltage level Vpg in the verifying mode.

Figure 4:
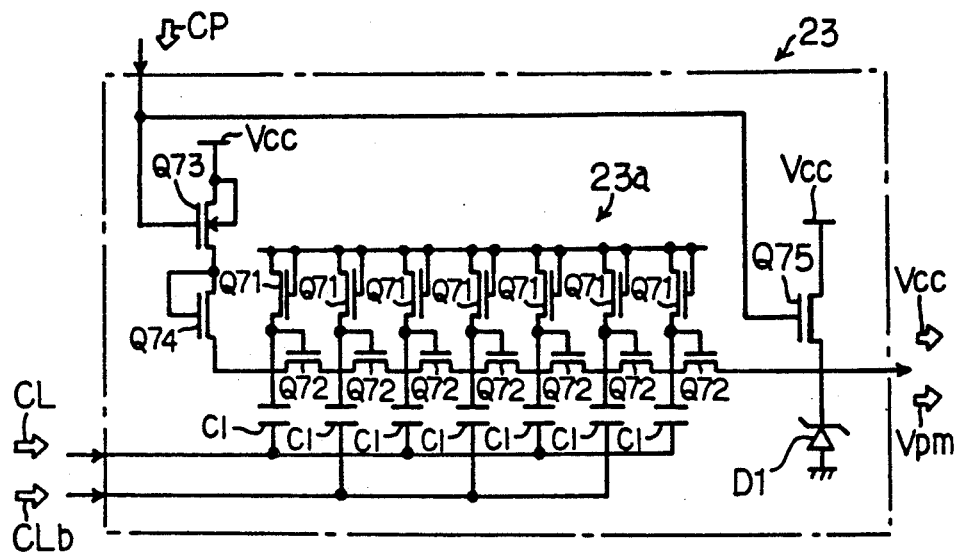
FIG. 4 is a circuit diagram showing the circuit arrangement of an internal step-up circuit incorporated in the electrically erasable and programmable read only memory device according to the present invention.

Turning to FIG. 4 of the drawings, the internal step-up circuit 23 comprises a bootstrap circuit 23a fabricated from load transistors Q71, bootstrap transistors Q72 and capacitors C1, a series combination of a switching transistor Q73 and a load transistor Q74 for activating the bootstrap circuit 23a, and a series combination of a depletion type switching transistor D75 and a zener diode D1.

Figure 5:
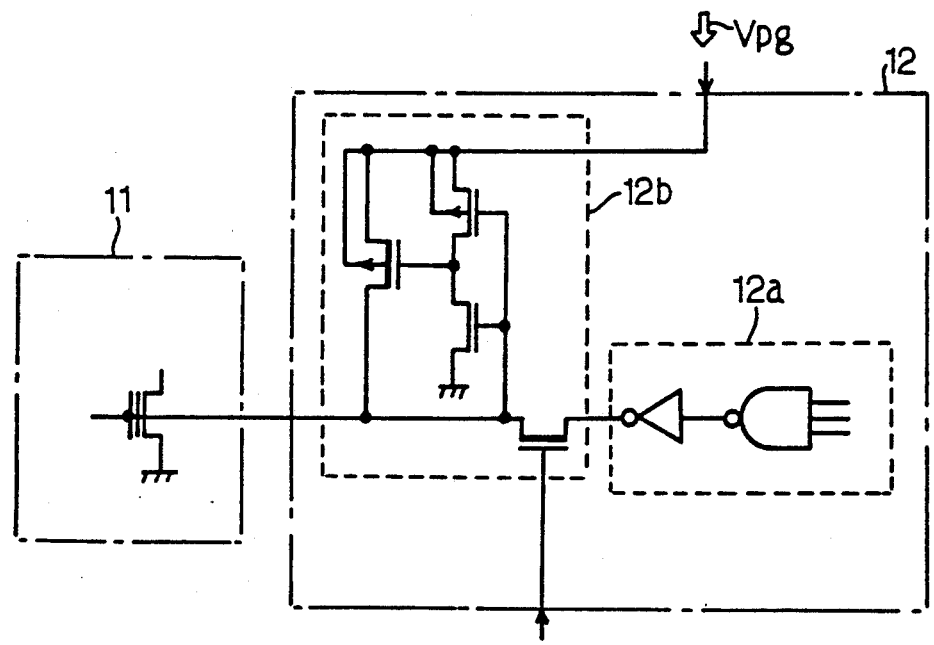
FIG. 5 is a circuit diagram showing the circuit arrangement of a row address decoder unit incorporated in the electrically erasable and programmable read only memory device according to the present invention.

FIG. 5 illustrates the row address decoder circuit 2, and the row address decoder circuit 12 comprises a decoder 12a and a verify voltage supply controlling circuit 2b.

In the erasing mode of operation, electrons accumulated in the floating gates of all the n-channel floating gate type memory cells M11 to Mmn are evacuated to the source line S, and the n-channel floating gate type memory cells M11 to Mmn are decreased in threshold to the low level ranging between 1 volt and 2 volts.

In the programming mode of operation, the row and column address decoder units 12 and 15 sequentially selects the memory cells M11 to Mmn, and the write-in voltage Vpp is selectively applied to the drain node of the selected memory cell. Then, electrons are injected into the drain node of the selected memory cell, and the selected memory cell is increased in threshold level toward the high level. When the programming operation is carried out, the verifying operation follows, and the n-channel floating gate type memory cell is checked to see whether or not the threshold level is elevated to an appropriate level usually higher than 9 volts. If not, the programming operation is repeated.

In the verifying operation, the verify voltage level Vpg is applied from the internal step-up circuit 23 through the voltage clamping circuit 24 and the row address decoder unit 12 to the control gate electrode to see whether or not the threshold level is higher than the verify voltage level Vpg, and the sense amplifier circuit 17 determines the threshold level to be higher or lower than the verify voltage level Vpg.

In the read-out operation, the row address bits and the column address bits cause the row address decoder unit 12 and the column address decoder/ selector unit 15 to select an n-channel floating gate type memory cell from the memory cell array 11. The row address decoder unit 12 supplies the positive power voltage level Vcc to the associated word line, and the column selector 16 allows the current to flow from the sense amplifier circuit 17 into the associated digit line. If the selected memory cell has the low threshold level, the n-channel floating gate type memory cell fully turns on, and the current passes therethrough. On the other hand, if the selected memory cell has the high threshold level, the current Im does not flow through the selected memory cell. The sense amplifier unit 17 compares the current with reference current, and determines the threshold level. The sense amplifier circuit 17 reports the result to the input/ output data buffer unit 19, and the input/ output data buffer unit 19 produces the output data signal of either logic level depending upon the threshold level of the selected memory cell.

As will be appreciated from the foregoing description, the electrically erasable and programmable read only memory device internally produces the verify voltage level Vpg from the positive power voltage level Vcc, and any source of verify voltage level is not incorporated in an electronic system equipped with the electrically erasable and programmable read only memory device according to the present invention.

Second Embodiment

Figure 6:
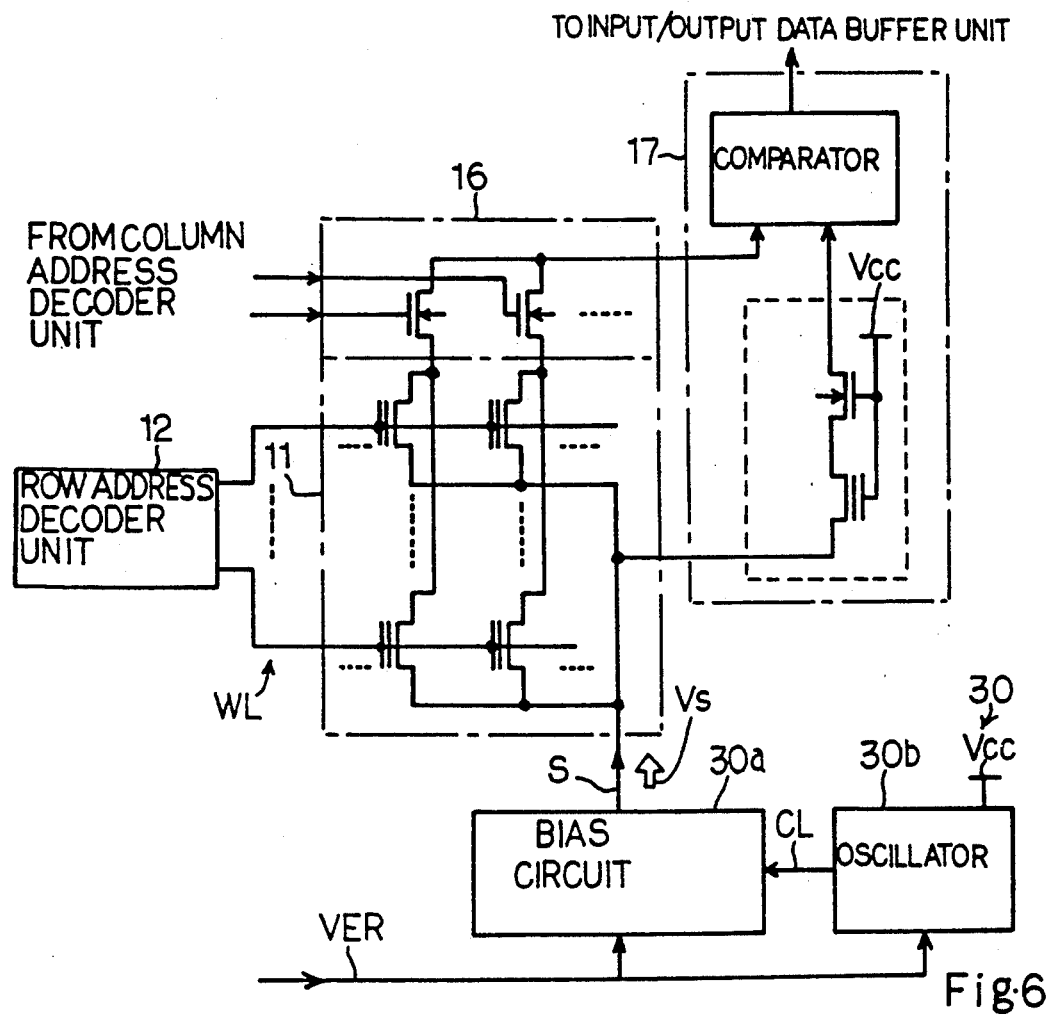
FIG. 6 is a circuit diagram showing the circuit arrangement of a memory cell array associated with a bias circuit incorporated in another electrically erasable and programmable read only memory device according to the present invention.

Turning to FIG. 6 of the drawings, an essential part of another electrically erasable and programmable read only memory device embodying the present invention is illustrated. The electrically erasable and programmable read only memory device embodying the present invention is similar in arrangement to the first embodiment except for a bias unit 30 coupled with the source line S, and for this reason, the other components are labeled with the same references designating the corresponding components of the first embodiment without detailed description.

Figure 7:
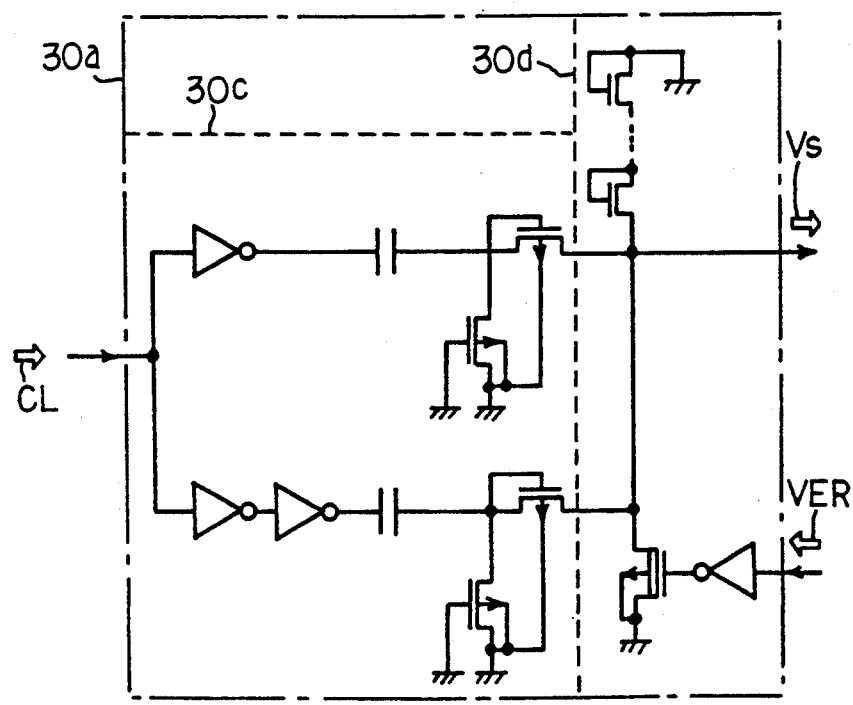
FIG. 7 is a circuit diagram showing the detailed arrangement of the bias circuit shown in FIG. 6.

The bias unit 30 comprises a bias circuit 30a and an oscillator 30b, and the oscillator is responsive to the internal control signal VER indicative of the verifying mode for producing the clock signal CL from the power voltage Vcc. With the clock signal CL, the bias circuit 30a negatively biases the source line S with respect to the ground voltage level. As will be better seen from FIG. 7, the bias circuit 30a comprises a negative voltage producing circuit 30c and a negative voltage supply circuit 30d, and the negative voltage supply circuit 30d is responsive to the internal control signal VER for supplying the negative bias voltage produced by the negative bias voltage producing circuit 30a to the source line S. However, the negative voltage supply circuit 30d allows the source line to remain in the ground voltage level except for the verifying mode of operation.

The source line S propagates the negative bias voltage Vs to the source nodes of all the memory cells of the memory cell array 11 in the verifying mode. However, the source line S is kept in the ground voltage level in the read-out mode of operation. The row address decoder unit 12 selectively drives the word lines WL to the positive power voltage level Vcc in not only the read-out mode but also the verifying mode of operation. As a result, the differential voltage between the control gate and the source node of each memory cell becomes larger in the verifying mode rather than in the read-out mode. This is equivalent to the verifying voltage higher than the read-out voltage, and the same advantages are also achieved by the second embodiment.

In this instance, the bias unit 30 is implemented by a verifying voltage producing circuit, and the negative bias voltage Vs serves as a verify voltage level.

Although particular embodiments of the present invention have been shown and described, it will be obvious to those skilled in the art that various changes and modifications may be made without departing from the spirit and scope of the present invention.

What is claimed is:

1. An electrically erasable and programmable read only memory device selectively entering an erasing mode, a programing mode, a verifying mode and a read-out mode of operation, comprising:

a) a plurality of electrically erasable and programmable memory cells having respective accumulating electrodes for accumulating carriers, and respective control electrodes associated with said accumulating electrodes for producing respective conductive channels between respective source nodes and respective drain nodes under the influence of said accumulating electrodes, and each selectively entering an erased state and a programmed state depending upon the amount of said carriers accumulated in the accumulating electrode;

b) a plurality of word lines selectively coupled with said control electrodes of said plurality of electrically erasable and programmable memory cells;

c) a plurality of digit lines selectively coupled with said drain nodes of said plurality of electrically erasable and programmable read only memory cells;

d) a word line selecting means coupled with said plurality of work lines, and supplying a read-out voltage to one of said plurality of work lines in said read-out mode and a verify voltage higher than said read-out voltage in said verifying mode;

e) a verify voltage producing circuit operative to produce said verify voltage rom a power voltage supplied from the outside of said electrically erasable and programmable read only memory device in said verifying mode, and supplying said verify voltage to said word line selecting means, said verify voltage producing circuit comprising an oscillator for producing clock signals from said power voltage, a bootstrapping circuit responsive to said clock signals for producing a boosted voltage, and a voltage clamping circuit for producing said verify voltage from said boosted voltage;

f) a sense amplifier unit operative to check an electrically erasable and programmable read only memory cell selected from the said plurality of electrically erasable and programmable read only memory cells to be whether in said erased state or in said programed state;

g) a write-in unit supplying a write-in voltage to an electrically erasable and programmable read only memory cell selected from said plurality of electrically erasable and programmable read only memory cells for injecting said carriers into said accumulating electrode;

h) a column selecting means operative to couple one of said plurality of digit lines to said sense amplifier unit in said verifying mode and said read-out mode and to said write-in unit in said programming mode; and i) a data buffer unit coupled with said sense amplifier unit and said write-in unit, and operative to supply a write-in data signal to said write-in unit in said programming mode and to produce a read-out data signal in said verifying mode and said read-out mode.

2. An electrically erasable and programmable read only memory device selectively entering an erasing mode, a programming mode, a verifying mode and a read-out mode of operation, comprising:

a) a plurality of electrically erasable and programmable memory cells having respective accumulating electrodes for accumulating carriers, and respective control electrodes associated with said accumulating electrodes or producing respective conductive channels between respective source nodes and respective drain nodes under the influence of said accumulating electrodes, and each selectively entering an erased sate and a programmed state depending upon the amount of said carriers accumulated in the accumulating electrode;

b) a plurality of work lines selectively coupled with said control electrodes of said plurality of electrically erasable and programmable memory cells;

c) a plurality of digit lines selectively coupled with said drain nodes of said plurality of electrically erasable and programmable read only memory cells;

d) a word line selecting means coupled with said plurality of word lines, and supplying a read-out voltage to one of said plurality of word lines in said read-out mode and said verifying mode;

e) a source liens coupled wit the source nodes of said plurality of electrically erasable and programmable read only memory cells;

f) a verify voltage producing circuit operative to produce a verify voltage opposite in polarity than said read-out voltage form a power voltage supplied from the outside of said electrically erasable and programmable read only memory device in said verifying mode, and supplying said verify voltage to said source line, said verify voltage producing circuit comprising an oscillator circuit operative to produce a clock signal form said power voltage in said verifying mode, and a bias circuit activated in said verifying mode, and producing said verifying voltage from said clock signal;

g) a sense amplifier unit operative to check an electrically erasable and programmable read only memory cell selected from said plurality of electrically erasable and programmable read only memory cells to be whether in said erased state or in said programmed state;

h) a write-in unit supplying a write-in voltage to an electrically erasable and programmable read only memory cell selected from said plurality of electrically erasable and programmable read only memory cells for injecting said carriers into said accumulating electrode;

i) a column selecting means operative to couple one of said plurality of digit lines to said sense amplifier unit in said verifying mode and said read-out mode and to said write-in unit in said programming mode; and j) a data buffer unit coupled with said sense amplifier unit and said write-in unit, and operative to supply a write-in date signal to said write-in unit in said programming ode and to produce a read-out data signal in said verifying mode and said read-out mode.

3. An electrically erasable and programmable read only memory device as set forth in claim 2, in which said bias circuit comprises a negative voltage producing circuit for producing a negative voltage from said clock signal, and a negative voltage supply circuit responsive to an internal control signal indicative of said verifying mode, and operative to regulate said negative voltage to a certain level for said verifying voltage in the presence of said internal control signal and to supply a ground voltage to said source line in the absence of said internal control signal.

* * * * *

UNITED STATES PATENT AND TRADEMARK OFFICE
CERTIFICATE OF CORRECTION

PATENT NO. : 5,305,260
DATED : April 19, 1994
INVENTOR(S) : Kazuhisa Ninomiya

It is certified that error appears in the above-identified patent and that said Letters Patent is hereby corrected as shown below:

Col. 4, line 65, delete "Cell" and insert --cell--.
Col. 5, line 66, delete "d".
Col. 7, line 22, delete "2b" and insert --12b--.
Col. 10, line 18, delete "liens" and insert --lines--.

Signed and Sealed this

Third Day of January, 1995

Attest:

BRUCE LEHMAN

Attesting Officer    Commissioner of Patents and Trademarks